(12) United States Patent  (10) Patent No.: US 8,088,545 B2
Shimotani et al.  (45) Date of Patent: Jan. 3, 2012

(54) PRODUCTION APPARATUS AND PRODUCTION METHOD OF WIRED MEMBER USING ELECTROPHOTOGRAPHIC METHOD

(75) Inventors: Kei Shimotani, Kanagawa (JP); Takayuki Takeuchi, Kanagawa (JP); Tetsuro Kodera, Kanagawa (JP); Taishi Shigematsu, Kanagawa (JP); Masaki Hirakata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 869 days.

(21) Appl. No.: 12/140,617

(22) Filed: Jun. 17, 2008

(65) Prior Publication Data

US 2009/0097882 A1  Apr. 16, 2009

(30) Foreign Application Priority Data

Oct. 12, 2007 (JP) ................................. 2007-266376

(51) Int. Cl.
*G03G 5/00* (2006.01)
(52) U.S. Cl. ............... 430/120.2; 430/124.5; 430/125.3; 430/125.6; 430/5; 399/297; 399/308
(58) Field of Classification Search .............. 430/120.2, 430/124.5, 125.3, 125.6, 5; 399/297, 308
See application file for complete search history.

(56) References Cited

U.S. PATENT DOCUMENTS 5,641,597 A  6/1997  Ushio et al.
2002/0083858 A1  7/2002  MacDiarmid et al.

FOREIGN PATENT DOCUMENTS

JP  A-08-088456  4/1996
JP  A-2001-284770  10/2001
JP  A-2005-302842  10/2005

OTHER PUBLICATIONS

Hidenori Okuzaki, "Coloring Material"; vol. 76, 260 (2003); pp. 14-18. (with partial translation).
Hohnholz et al; "Plastic Electronic Devices Through Line Patterning of Conducting Polymers"; *Advanced Functional materials;* vol. 15, No. I (2005); pp. 51-56.

*Primary Examiner* — Mark Chapman
(74) *Attorney, Agent, or Firm* — Oliff & Berridge, PLC

(57) ABSTRACT

Disclosed is a production apparatus of a wired member, including: a mask forming unit that forms a mask on a transfer substrate by using a toner in accordance with an electrophotographic method so as to be transferable to a member to be wired, the mask corresponding to a wiring pattern to be formed on the member to be wired; a mask transferring unit that transfers the mask formed on the transfer substrate by the toner to the member to be wired; a conductive film forming unit that supplies a conductive material onto the mask-transferred side of the member to be wired to form a film of the conductive material thereon; and a mask removing unit that removes the mask from the member to be wired on which the film of the conductive material has been formed.

16 Claims, 11 Drawing Sheets

←→ 200μm

←——→ 200μm

←——→ 100μm

— 0.5mm

PRODUCTION APPARATUS AND PRODUCTION METHOD OF WIRED MEMBER USING ELECTROPHOTOGRAPHIC METHOD

CROSS-REFERENCE TO RELATED APPLICATIONS

This application is based on and claims priority under 35 USC 119 from Japanese Patent Application No. 2007-266376 filed Oct. 12, 2007.

BACKGROUND

1. Technical Field

The present invention relates to a production apparatus and a production method of a wired member using an electrophotographic method such as laser printing.

2. Related Art

Research and development of electronic devices using organic materials have been vigorously conducted in recent years. Accompanying such a development, studies on performing integration and wiring by using a rotary press or a printer in accordance with a printing system have been progressing. According to such a method utilizing a printing system, the conditions of vacuum and high temperature and extremely expensive apparatuses, which are utilized for producing a current semiconductor integrated circuit, become unnecessary, so that large quantities of electronic devices can be inexpensively produced. Presently, the following have been proposed as specific methods thereof: a direct drawing method by an ink jet printer, a screen printing method which produces a plate and performs printing with it, and a line patterning method which uses a laser printer.

In particular, the method using a printer is expected to allow inexpensive production of an electronic device since a plate for screen printing or an optical mask for producing an ordinary semiconductor circuit is unnecessary. Further, this method is appropriate not only for the case of producing the same device in large amounts, but also for the case of producing one specially ordered circuit element since a circuit designed by an ordinary personal computer (PC) can be easily printed on demand.

Printing using a printer does not necessitate a high-temperature process as in production of a semiconductor circuit, and thus can produce a circuit on a substrate having flexibility such as a plastic substrate, and thus has a new applicability to electronic devices such as a flexible display and electronic paper.

Among the methods using a printer, a line patterning method using a laser printer is, as shown in FIG. 11 for example, composed mainly of a step of printing a negative mask (a toner mask) 106 onto a circuit substrate 102 by a toner (FIG. 11(A)), a step of applying a conductive material 108 (FIG. 11(B)), and a step of removing the toner mask 106 (FIG. 11(C)). This method can output a circuit pattern on the circuit substrate (substrate to be wired) 102 in the same manner as in outputting it from a PC to an ordinary printer. In this case, as described above, an optical mask and a printing mask are unnecessary, so that any circuit can be designed inexpensively. Then, a conductive paste of organic material or inorganic material is applied to the toner mask printed onto the substrate. Such a method allows producing a wiring substrate as well as a semiconductor device. This method is a promising technique in the field of so-called printable electronics.

On the other hand, as parts or products having an electronic circuit or wiring are miniaturized more and more, it is necessary that the wiring and the like be disposed three-dimensionally to miniaturize it as a whole. From such a viewpoint, techniques for wiring on a curved surface by which wiring and the like can be efficiently disposed are very important.

In a conventional line patterning method such as shown in FIG. 11, toner particles existing in a non-image area (namely, an area in which wiring is to be formed) often causes a decrease in application properties of a conductive material, and high resistance or disconnection of a conduction path part or a wiring part.

SUMMARY

According to an aspect of the invention, there is provided a production apparatus of a wired member, including: a mask forming unit that forms a mask on a transfer substrate by using a toner in accordance with an electrophotographic method so as to be transferable to a member to be wired, the mask corresponding to a wiring pattern to be formed on the member to be wired; a mask transferring unit that transfers the mask formed on the transfer substrate by the toner to the member to be wired; a conductive film forming unit that supplies a conductive material onto the mask-transferred side of the member to be wired to form a film of the conductive material thereon; and a mask removing unit that removes the mask from the member to be wired on which the film of the conductive material has been formed.

BRIEF DESCRIPTION OF THE DRAWINGS

Exemplary embodiments of the present invention will be described in detail based on the following figures, wherein.

DETAILED DESCRIPTION

An exemplary embodiment of the present invention is hereinafter described while referring to the attached Figs.

Figure 1:
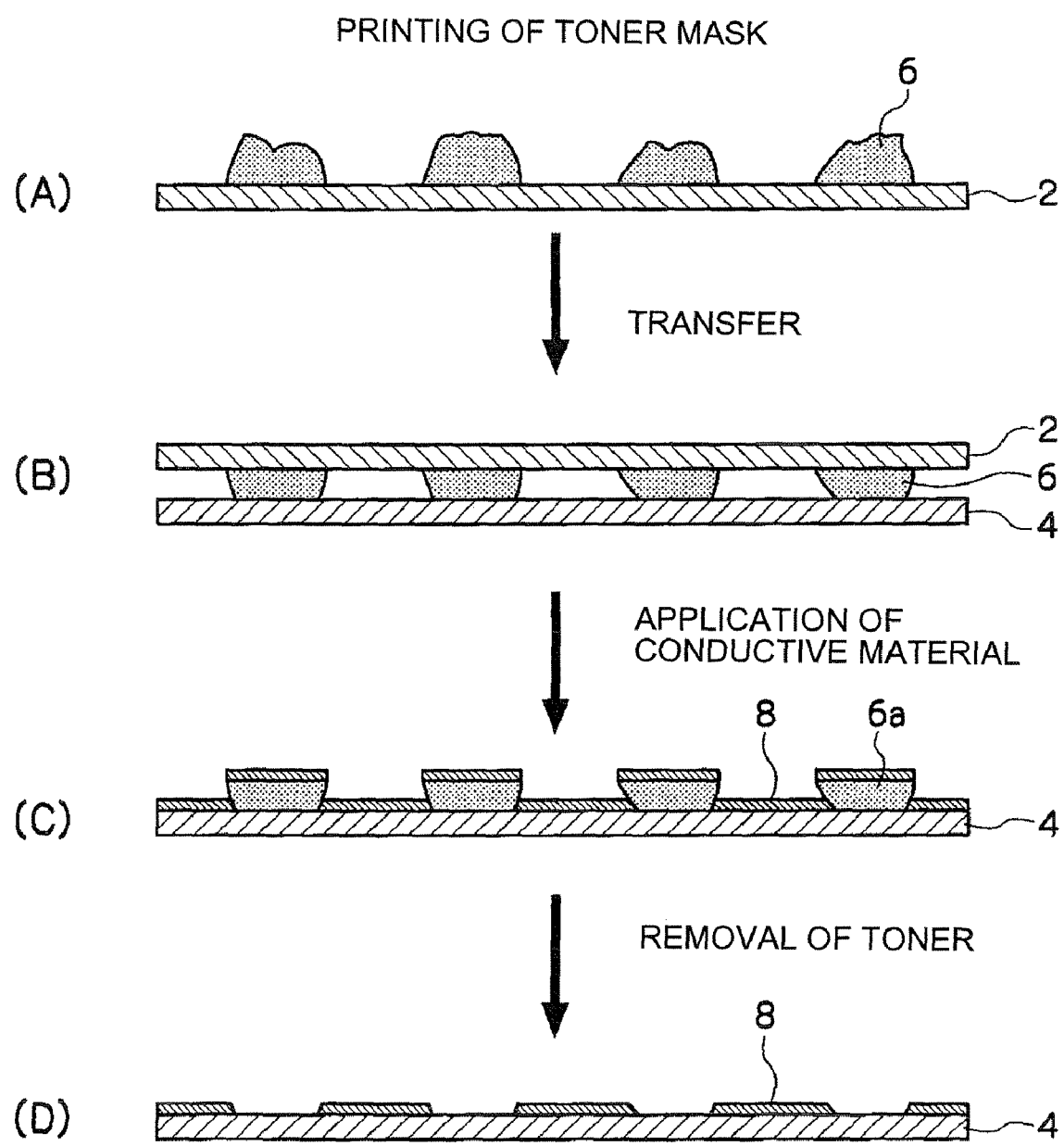
FIG. 1 is a process drawing showing one exemplary embodiment of a production method of a wired member according to the invention.

FIG. 1 schematically shows a production process of a wired member according to the exemplary embodiment. A production method of a wired member according to the exemplary embodiment includes forming a mask 6 on a transfer substrate 2 by using a toner in accordance with an electrophotographic method so as to be transferable to a member to be wired 4, the mask 6 corresponding to a wiring pattern to be formed on the member to be wired 4 (FIG. 1(A)); transferring the mask 6 formed on the transfer substrate 2 by the toner to the member to be wired 4 (FIG. 1(B)); supplying a conductive material onto the mask 6 transferred-side of the member to be wired 4 to form a film of the conductive material thereon (FIG. 1(C)); and removing the mask from the member to be wired on which the film of the conductive material has been formed (FIG. 1(D)).

Figure 2:
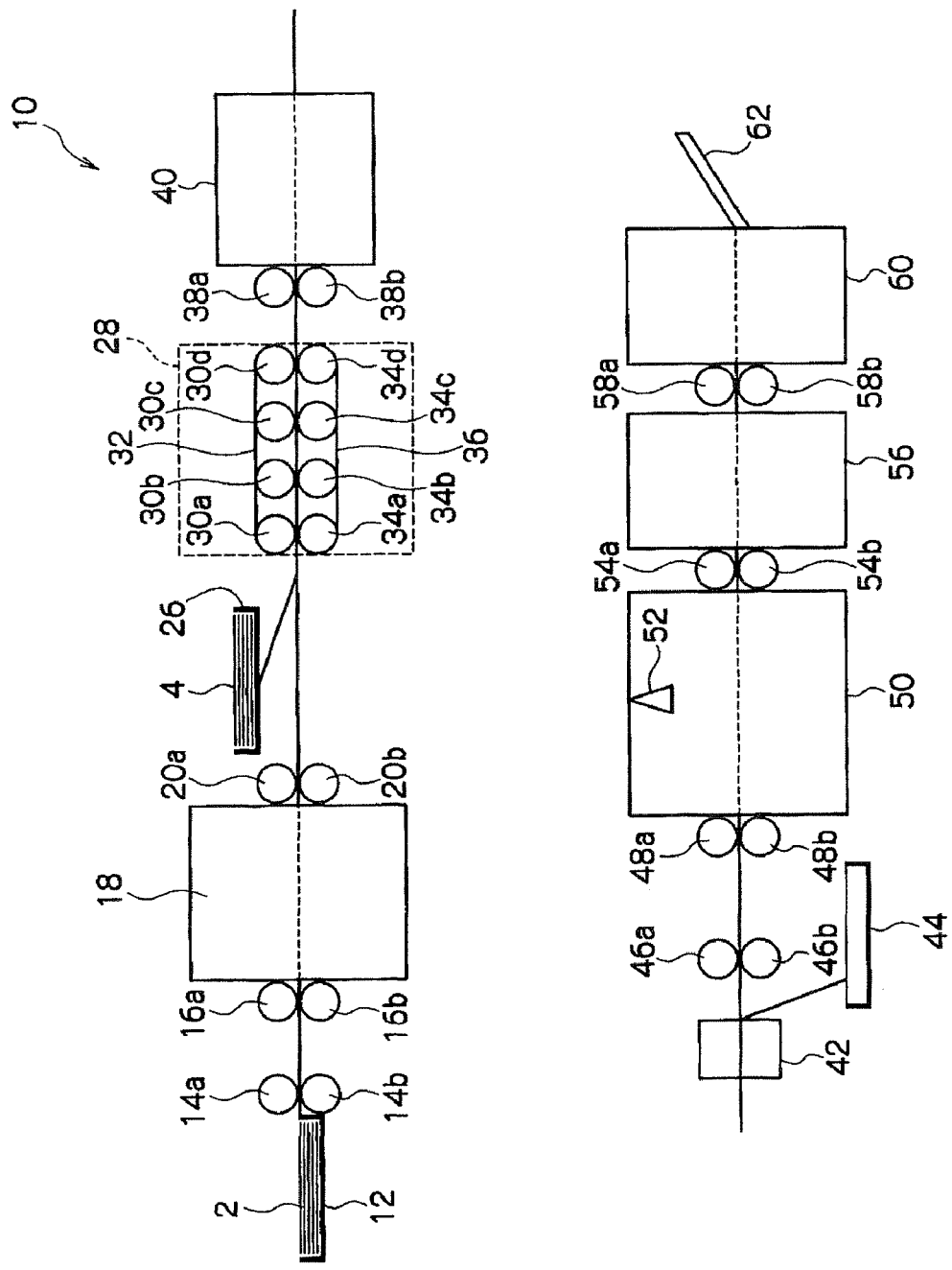
FIG. 2 is a schematic drawing showing one exemplary embodiment of a production apparatus of a wired member according to the invention.

Such a production of a wired member according to the exemplary embodiment may be performed by an apparatus having a constitution as shown in FIG. 2. In FIG. 2, an apparatus 10 is drawn so as to be separated into two parts for the convenience of the space. The apparatus 10 according to the exemplary embodiment is composed mainly of a mask forming unit 18, a mask transferring unit 28, a conductive film forming unit 50, and a mask removing unit 60. A method for producing a wired member by using the apparatus 10 according to the exemplary embodiment is specifically described hereinafter.

<Mask Forming Step>

First, a substrate (a substrate to be wired) 4 to be finally wired and a substrate (a transfer substrate) 2 which temporarily has a mask 6 formed thereon by a toner and is used for transferring the mask 6 onto the substrate to be wired 4 are prepared. Then the mask 6 corresponding to a wiring pattern to be formed on the substrate to be wired 4 is formed on the transfer substrate 2 by using a toner in accordance with an electrophotographic method so as to be transferable to the substrate to be wired 4 (FIG. 1(A)).

For example, a wiring pattern is designed by using a PC. At this time, a so-called negative mask in which a wiring area is a non-image area is produced by using a drawing software or a CAD. The width and interval of wiring are not limited but may be designed for necessary wiring width and interval, which may be of μm order such as an electronic circuit formed in the semiconductor production process, or mm order.

After producing the negative mask in a computer, the negative mask 6 is formed on the transfer substrate 2 by using a toner in accordance with an electrophotographic method in a mask forming unit 18. A laser printer or a copying machine for forming a toner image in accordance with an electrophotographic method, which is provided with a photoreceptor, a laser light source and the like, may be used as the mask forming unit 18, and those having a resolution corresponding to a wiring pattern to be formed may be selected. If the wiring pattern is asymmetrical, the negative mask is output in a mirror image when the negative mask produced in a computer is printed on the transfer substrate 2. The transfer substrate 2 stored in a tray 12 is supplied to the mask forming unit 18 by feed rollers 14*a* and 14*b* and conveying rollers 16*a* and 16*b*, and the mask 6 (occasionally referred to as toner mask, toner image or mask image in the specification) formed by a toner is output on the transfer substrate 2 through the processes of electrification of a photoreceptor, exposure, development and transfer, similarly to ordinary printing. Here, the toner mask 6 on the transfer substrate 2 needs to be formed so as to be transferable to the substrate to be wired 4 but to adhere to the transfer substrate 2 with such force as not to be peeled off therefrom. Thus, after forming the toner mask 6 on the transfer substrate 2, the toner particles are melted and integrated with each other, but adhere to the transfer substrate 2 with comparatively weak force.

Accordingly, the transfer substrate 2 to be used is such that the toner mask 6 is formed thereon and the toner is not completely fixed but transferable to the substrate to be wired 4 by, for example, heating and pressing. Examples thereof include resin substrates made of polyethylene terephthalate (PET), polyethylene naphthalate (PEN), aromatic polyamide (aramid), polyether imide (PEI), polyacetate, cellulose triacetate, nylon, polyester, polycarbonate, polysulfone, polystyrene, polyphenylene sulfide, polyphenylene ether, cycloolefin, polypropylene, polyimide, cellophane and ABS (acrylonitrile butadiene styrene) resin. The transferability of the toner mask 6 may be adjusted by providing a release layer on the surface of the transfer substrate 2 or performing surface treatment.

The size of the transfer substrate 2 may be determined in accordance with the size of the substrate to be wired 4, a wiring pattern to be formed and the standard of the mask forming unit 18 to be used, and the thickness of the transfer substrate 2 may be a thickness having flexibility. For example, when the transfer substrate 2 is a resin film with a thickness of approximately 50 μm to 0.2 mm, it may be subject to printing even in a general laser printer, and the toner mask 6 may be easily formed on the substrate 2. If the transfer substrate 2 has flexibility, for example, not only in the case where a substrate (a member) to be wired is flat but also in the case where the substrate has a curved surface, mask transfer may be performed easily and certainly onto the curved surface of the member to be wired by curving the transfer substrate 2 having the mask 6 formed thereon.

On the other hand, a toner to be used is such that the mask 6 may be formed (printed) on the transfer substrate 2 and the toner is not completely fixed but transferable to the substrate to be wired 4 by, for example, heating and pressing. For example, if the transfer substrate 2 is a plastic substrate such as PET, a toner to be used for an ordinary image forming apparatus for an electrophotographic method may be used, and examples of the toner include a toner containing a binder resin and a coloring agent.

Examples of the binder resin include homopolymers and copolymers of styrenes, monoolefins, vinyl esters, α-methylene aliphatic monocarboxylates, vinyl ethers and vinyl ketones; particularly typical examples of the binder resin include polystyrene, styrene-alkyl acrylate copolymer, styrene-alkyl methacrylate copolymer, styrene-acrylonitrile copolymer, styrene-butadiene copolymer, styrene-maleic anhydride copolymer, polyethylene and polypropylene. In addition, examples thereof include polyester, polyurethane, epoxy resin, silicone resin, polyamide, modified rosin and paraffin wax.

The coloring agent is not particularly limited and typical examples thereof include magnetic powder such as magnetite and ferrite, carbon black, aniline blue, calcoil blue, chrome yellow, ultramarine blue, Dupont oil red, quinoline yellow, methylene blue chloride, phthalocyanine blue, malachite green oxalate, lamp black, rose bengal, C. I. pigment red 48:1, C. I. pigment red 122, C. I. pigment red 57:1, C. I. pigment yellow 97, C. I. pigment yellow 17, C. I. pigment blue 15:1 and C. I. pigment blue 15:3.

Known addition agents such as a charge control agent, a release agent and other inorganic particles may be subject to internal addition treatment or external addition treatment to toner.

Typical examples of a release agent include low-molecular polyethylene, low-molecular polypropylene, Fischer-Tropsch wax, montan wax, carnauba wax, rice wax and candelilla wax.

Known charge control agents may be used such as an azo metal-complex compound, a metal-complex compound of salicylic acid and resin type ones containing a polar group.

As other inorganic particles, small-diameter inorganic particles having an average primary particle diameter of 40 nm or less may be used for the purpose of powder fluidity and charge control, and additionally larger-diameter inorganic or organic particles than them may be used together as required for decreasing adhesive force. Known inorganic particles may be used for these other inorganic particles.

Small-diameter inorganic particles may be effectively surface-treated for improving dispersibility and thus enhancing the effect of improving powder fluidity.

The average particle diameter of toner particles is, for example, 1 to 20 μm or 5 to 10 μm from the viewpoint of the improvement in resolution of a wiring pattern, the restraint of toner particles scattering and the prevention of scattered toner particles transfer.

On the other hand, the thickness of the toner image 6 is a thickness such that scattered toner particles in a non-image area are not transferred to the substrate to be wired 4 and a film 8 of the conductive material may be formed in the non-image area after being transferred to the substrate to be wired 4. Specifically, the thickness of the toner image 6 is, for example, 3 to 20 μm or 5 to 20 μm. A thickness of the toner image 6 of 3 μm or more may certainly prevent toner particles scattered in the non-image area from being transferred together to the transfer substrate 2, while a thickness of 20 μm or less may certainly prevent definition of the mask 6 after being transferred from decreasing.

<Mask Transferring Step>

Next, the mask 6 formed on the transfer substrate 2 by a toner is transferred to the substrate to be wired 4 (FIG. 1(B)). Specifically, the toner mask 6 is formed (printed) on the transfer substrate 2, which is thereafter supplied to a mask transferring unit 28 through conveying rollers 20a and 20b, and concurrently the substrate to be wired 4 is supplied from a tray 26.

The substrate to be wired 4 may be prepared in accordance with the application thereof. For example, a substrate made of any of the resin materials as listed above for the transfer substrate 2 may be used, but a substrate having larger adhesive force to the toner than that of the transfer substrate 2 is selected so that the toner mask 6 on the transfer substrate 2 may be transferred.

The mask transferring unit 28 is provided with, for example, heating and pressing rollers 30a to 30d and 34a to 34d having a heater therein, and conveying belts 32 and 36 suspended on these rollers 30a to 30d and 34a to 34d, and applies heat and pressure in a state such that the mask 6-formed side of the transfer substrate 2 and the wiring-formed side of the substrate to be wired 4 are oppositely superposed. At this time, temperature and pressure are determined so that the toner mask 6 on the transfer substrate 2 is transferred to the substrate to be wired 4 in consideration of the material for each of the substrates 2 and 4 and the kind of the toner that forms the mask 6. For example, in the case where the transfer substrate 2 and the substrate to be wired 4 are each a plastic substrate, the temperature of the heating and pressing rollers 30a to 30d and 34a to 34d is set at approximately 80 to 130° C., and the pressure thereof is set at approximately 0.5 to 2 MPa. Also, for example, the toner mask 6 on the transfer substrate 2 may be easily transferred to the substrate to be wired 4 by providing a heater only for the rollers 34a to 34d at the transfer substrate 2 side, or setting the temperature of the rollers 34a to 34d at the transfer substrate 2 side to be higher than that of the rollers 30a to 30d at the substrate to be wired 4 side.

The transfer substrate 2 and the substrate to be wired 4 are conveyed through the mask transferring unit 28 to a cooling unit 40 by conveying rollers 38a and 38b. After lowering the temperature of both of the substrates 2 and 4 therein, both of the substrates 2 and 4 in a state of being superposed are further conveyed to a peeling unit 42 and separated from each other. At this time, the difference in adhesive force of toner between both of the substrates 2 and 4 allows the mask image 6 on the transfer substrate 2 to be transferred to the substrate to be wired 4. A transfer method of the toner mask 6 is not particularly limited if the toner mask 6 may be transferred from the transfer substrate 2 to the substrate to be wired 4; for example, the transfer is performed by pressing and heating, or by cooling after pressing and heating. Alternatively, the transfer may be electrostatically performed.

The transfer substrate 2 after being peeled off is stored in a tray 44 and the substrate to be wired 4 is conveyed to a conductive film forming unit 50 by conveying rollers 46a, 46b, 48a and 48b.

Incidentally, in the case where a laser printer provided with, for example, a photoreceptor and an intermediate transfer belt is used in the mask forming step for forming the toner mask on the transfer substrate 2, the intermediate transfer belt is so thin in thickness that the shape follows irregularities of the toner on the photoreceptor, and the intermediate transfer belt usually utilizes electrostatic transfer, so that the toner particles adhering to the non-image area are also easily transferred to the transfer substrate 2, for example, when the mask image 6 is transferred from the intermediate transfer belt to the transfer substrate 2. In addition, with regard to the transfer of the toner particles before being fixed, the toner particles are transferred as they are unlike a toner after being fixed, so that the difference is hardly exhibited in transfer efficiency between a toner in the non-image area and a toner in the image area. Thus, scattered toner exists in the non-image area of the toner image 6 formed by the output of an ordinary printer on the transfer substrate 2.

On the other hand, with regard to the toner image (mask) heated and pressed in the mask transferring step, the toner has been already melted and solidified and integrated into an image. Further, there is a large difference in height between the toner particles interspersed in the non-image area (the area to be finally wired) and the toner image 6 in the image area, so that transfer efficiency in the image area is increased as compared with the toner in the non-image area. Accordingly, this transferring step allows the toner image 6 on the transfer substrate 2 to be easily transferred to the substrate to be wired 4, and meanwhile restrains the toner particles adhering to the non-image area from being transferred.

<Conductive Film Forming Step>

After the toner image (the mask image) 6 on the transfer substrate 2 is transferred to the substrate to be wired 4, a conductive material is supplied onto the mask 6a-transferred side of the substrate to be wired 4 to form a film 8 of the conductive material in an area in which the mask 6a has not been formed (an area in which the surface of the substrate to be wired 4 is exposed) (FIG. 1(C)). At that time, a film of the conductive material may be simultaneously formed on the mask 6a. The film of the conductive material on the mask is removed together with the mask 6a at the time of removing the mask, so that the film 8 of the conductive material consequently remains only in an area in which the mask has not been formed.

A solution of a conductive material applicable onto the substrate to be wired 4 and suitable for intended resistance value may be used for supplying the conductive material. For wiring applications, examples of an inorganic material include gold, silver, copper paste and ITO paste, and examples of an organic material include 3,4-ethylenedioxythiophene/polystyrene sulfonic acid (PEDOT/PSS). Also, conductive (semiconductive) materials such as polythiophene, polyaniline, polypyrrole or derivatives thereof are usable. When applying a solution of the conductive material onto the substrate to be wired 4 having the toner image 6a transferred thereonto, water or alcohol may be used as the solvent thereof in order not to dissolve the toner therein.

The substrate to be wired 4 having the toner image 6a transferred thereonto is conveyed to a coating unit 50 to supply a solution of the conductive material from an ejector 52 onto the mask 6a-transferred side of the substrate to be wired 4. At this time, an area except the toner mask (the non-image area) is coated approximately uniformly with the conductive material, while the toner having a relatively irregular surface is coated with difficulty or not uniformly coated therewith. A method for applying a solution of the conductive material onto the substrate to be wired 4 having the toner mask 6a transferred thereonto is not limited to spray coating as described above, and other applying methods such as spin coating, dip coating and bar coating may be adopted.

After coating, the substrate to be wired 4 is conveyed to a drying unit 56 by conveying rollers 54a and 54b. The conductive material applied onto the substrate to be wired 4 is dried therein and sintered as required. Thus, the film 8 of the conductive material is formed in the non-image area on the substrate to be wired 4. The thickness of the conductive film 8 to be formed may be determined in accordance with the application, depending on the thickness of the toner mask; for example, the conductive film 8 having a thickness of 100 nm to 5 μm may be formed.

<Mask Removing Step>

After forming the conductive film 8, the substrate to be wired 4 is conveyed to a mask removing unit 60 by conveying rollers 58a and 58b to remove the toner mask 6a by performing ultrasonic cleaning in organic solvent, for example, with the use of acetone or toluene (FIG. 1(D)). At this time, the film of the conductive material existing on the mask 6a is also removed together with the toner of the mask 6a.

The organic solvent to be used in ultrasonic cleaning needs to remove only the toner image 6a without dissolving the substrate to be wired 4 and the conductive film 8 formed on the substrate 4, and the solvent may be selected in accordance with the material for each of the substrate to be wired 4, the conductive film 8 and the toner image 6a. The substrate to be wired 4 is discharged to a tray 62 after removing the toner mask 6a therefrom by ultrasonic cleaning. Thus, a wired substrate having the wiring pattern 8 initially designed is obtained.

Even though the toner particles adhere to the non-image area when the toner mask 6 is formed on the transfer substrate 2 in accordance with an electrophotographic method, the production of a wired substrate through each of the steps as described above does not cause those toner particles to be transferred to the substrate to be wired 4, allows application properties of the conductive material composing the wiring to be prevented from decreasing, and allows disconnection or higher resistance in a wiring part to be effectively prevented or restrained.

The invention is not limited to the above exemplary embodiments; for example, with regard to a production apparatus, a production apparatus having a different constitution from the constitution shown in FIG. 2 may be used.

EXAMPLES

Examples and comparative examples are hereinafter described but the invention is not limited to these examples.

Example 1

The following transfer film is produced as a transfer substrate.

10 parts of a silicone hard coating agent (trade name: SHC900, manufactured by GE Toshiba Silicone Corp., a solid content of 30% by mass) is added to 30 parts of a solution in which cyclohexanone and methyl ethyl ketone are mixed at a mass ratio of 10:90, and sufficiently stirred to prepare image-receiving layer coating solution. This image-receiving layer coating solution is applied on one side of a PET film (trade name: LUMIRROR 100T60, manufactured by Toray Industries Inc., thickness: 100 μm) by using wire bar, and dried at a temperature of 120° C. for 30 seconds to form an image-receiving layer having a film thickness of 1 μm, which is thereafter cut into A4 size (210 mm×297 mm).

A mask whose line width and line interval are both 200 μm is designed on a desktop PC by using a drawing software (trade name: ILLUSTRATOR, manufactured by Adobe Systems Incorporated.). On that occasion, the mask of the wiring is designed as a so-called negative mask in which an area to apply a conductive material (a wiring area) is not printed at all.

The above negative mask is printed in a mirror image on the image-receiving layer coated surface of the transfer film with DocuCenter C5540I (manufactured by Fuji Xerox Co., Ltd.). On that occasion, the toner is melted so that the negative mask is not peeled off from the transfer film but adheres thereto by weak force. EA-HG toner (black) typically mounted is used for the toner.

A PEN film (manufactured by Teijin Teonex Ltd., a thickness of 125 μm) as a substrate to be wired is superposed on the mask side of this transfer film to transfer the toner mask printed on the transfer film at a pressure of 1 MPa and a temperature of 85° C. for 30 seconds by using a vacuum heater press, which transfer film is peeled after being cooled.

Subsequently, spin coating is performed on the toner mask-transferred side of this substrate to be wired at normal temperature in the air by using silver paste (trade name: DCG-102C-CN20, manufactured by Sumitomo Metal Mining Co., Ltd., Ag of 20 wt %, water, surface-active agent). The number of revolutions on that occasion is approximately 1500 rpm. Thereafter, annealing is performed at a temperature of 120° C. in the air for 1 hour for sintering the particles of the silver paste. After annealing, ultrasonic cleaning is performed in acetone for 30 seconds by using an ultrasonic cleaner (trade name: UT-105S, manufactured by Sharp Corporation, an output of 35 kHz, 100 W) for removing the mask on the substrate to be wired.

Figure 3:
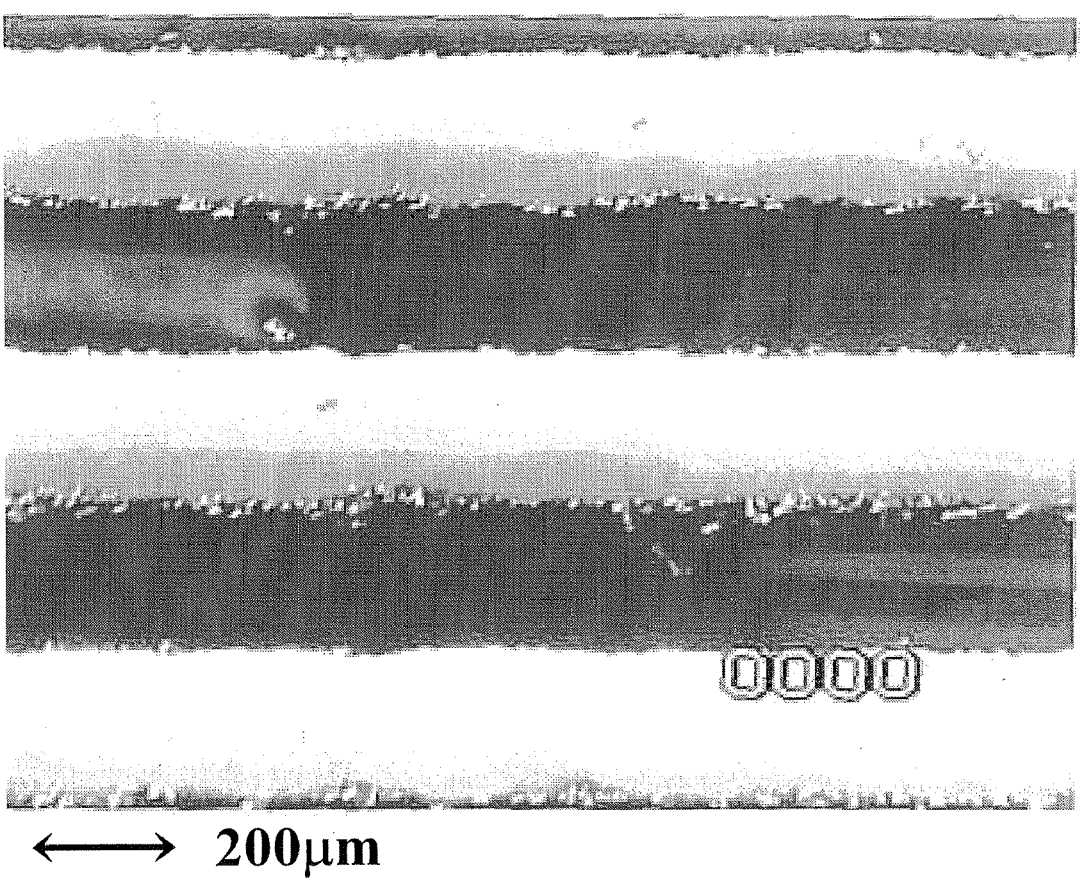
FIG. 3 is a microphotograph showing a part of silver wiring produced in Example 1.

After acetone cleaning, the substrate with the silver applied thereon is observed by a stereoscopic microscope. FIG. 3 is a microphotograph thereof. The black area is a silver wiring area and it is found that the silver wiring is evenly formed at a width of approximately 200 μm. When the silver wiring area of this substrate is measured by a surface roughness tester (trade name: Dektak 3030, manufactured by Sloan Corporation), the thickness is approximately 2 μm.

Figure 4:
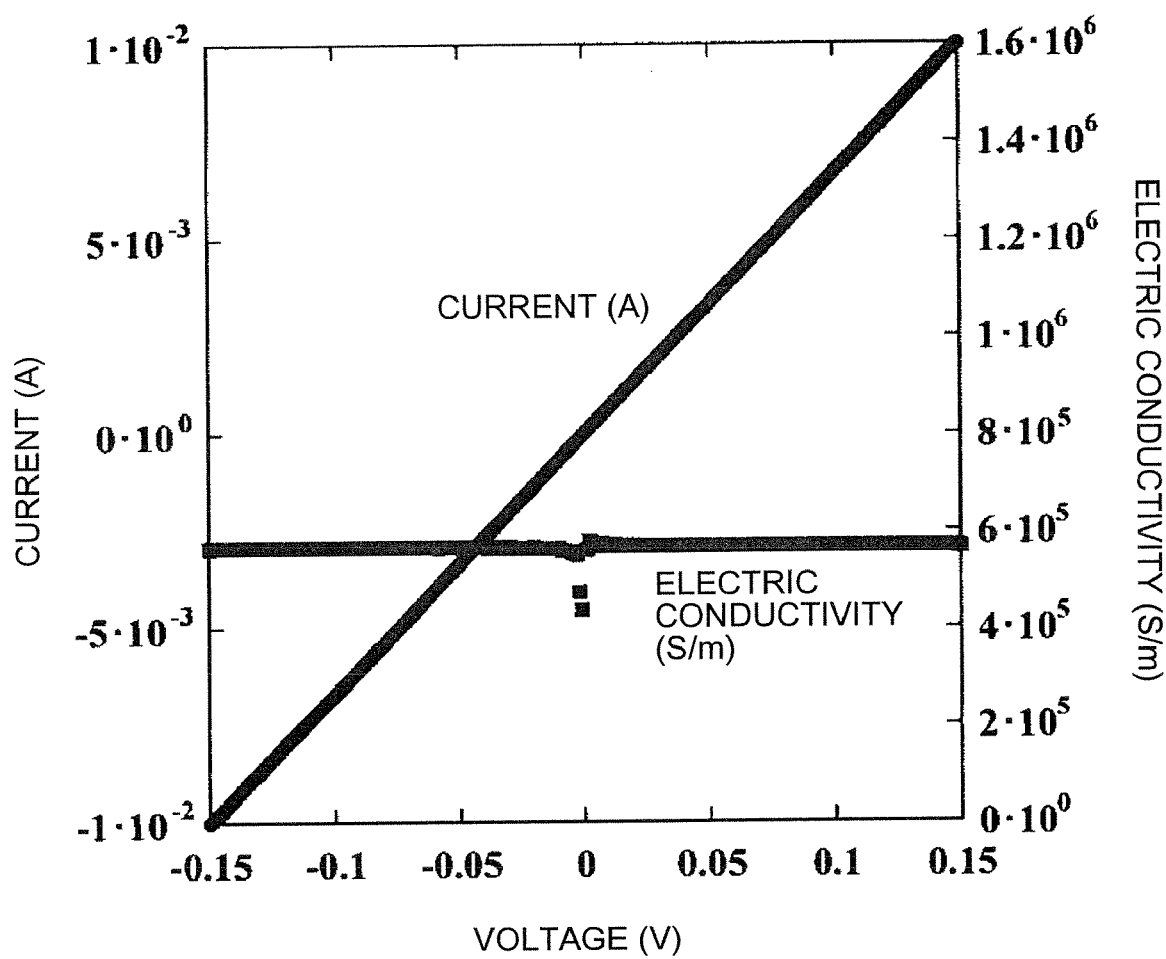
FIG. 4 is a view showing current-voltage characteristics measured for silver wiring produced in Example 1.

Next, current-voltage characteristics of the silver wiring are measured by using a semiconductor parameter analyzer (trade name: 4156B, manufactured by Agilent Technologies Japan, Ltd.) and a prober. The results are shown in FIG. 4. As shown in FIG. 4, the electric conductivity is approximately $6 \times 10^{5-}$ S/m, which is lower by approximately two digits as compared with Ag in bulk but yet sufficiently low resistance for the wiring. It is demonstrated that this method allows wiring to be performed on a plastic substrate.

Comparative Example 1

A mask whose line width and line interval are both 200 μm is designed on a desktop PC by using a drawing software (trade name: ILLUSTRATOR, manufactured by Adobe Systems Incorporated.). On that occasion, the mask of the wiring is designed as a so-called negative mask in which an area to apply a conductive material (a wiring area) is not printed at all.

The above negative mask is printed on an OHP film (trade name: XEROXSHEET, manufactured by Fuji Xerox Co., Ltd., a thickness of 100 μm) as the substrate to be wired with DocuCenter C5540I (manufactured by Fuji Xerox Co., Ltd.).

Subsequently, spin coating is performed on the toner mask-printed side of this substrate to be wired at normal temperature in the air by using silver paste (trade name: DCG-102C-CN20, manufactured by Sumitomo Metal Mining Co., Ltd., Ag of 20 wt %, water, surface-active agent). The number of revolutions on that occasion is approximately 1500 rpm. Thereafter, annealing is performed at a temperature of 120° C. in the air for 1 hour for sintering the particles of the silver paste. After annealing, ultrasonic cleaning is performed in acetone for 30 seconds by using an ultrasonic cleaner (trade name: UT-105S, manufactured by Sharp Corporation, an output of 35 kHz, 100 W) for removing the mask.

Figure 5:
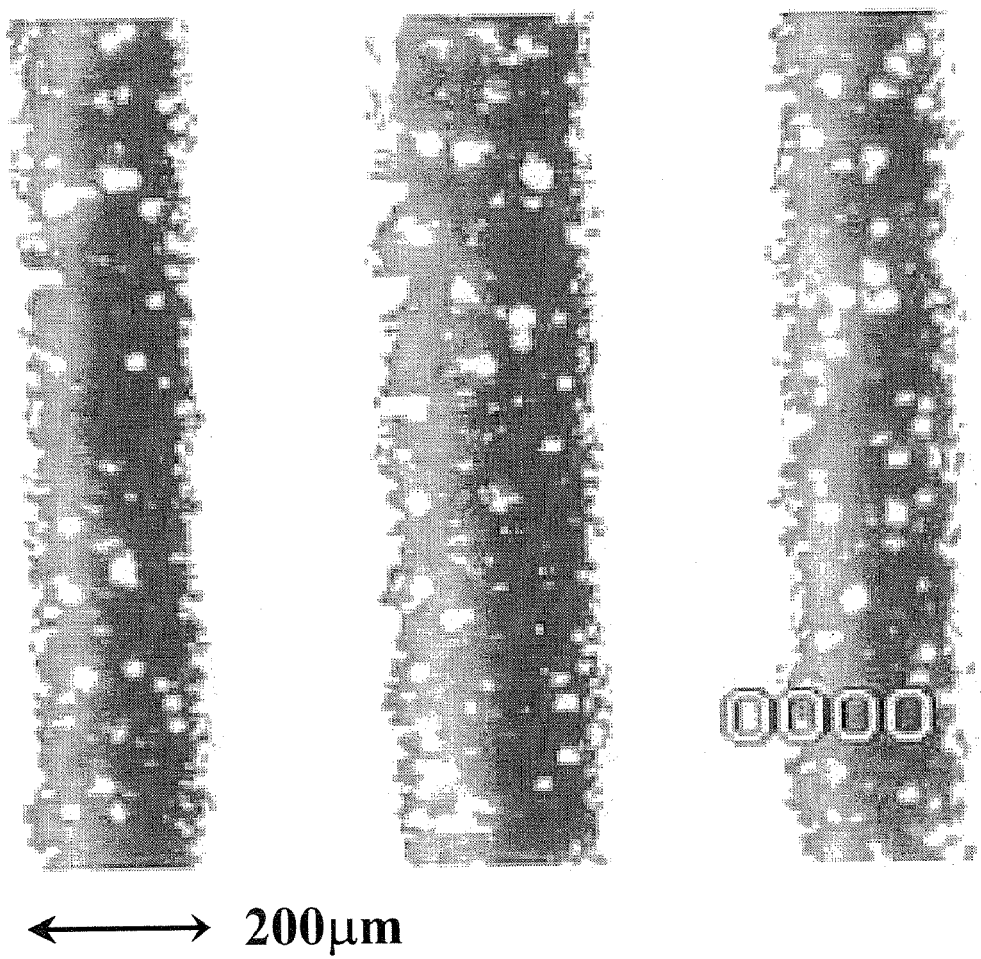
FIG. 5 is a microphotograph showing a part of silver wiring produced in Comparative Example 1.

After acetone cleaning, the substrate is observed by a stereoscopic microscope. FIG. 5 is a microphotograph thereof. The silver wiring is formed; however, a white dotted portion having no applied silver exists in the wiring area unlike Example 1. It is conceived that the reason therefor is that scattered toner exists in the non-image area and the silver paste is repelled and not applied thereon.

When measured by the same method as in Example 1, the film thickness of the wiring area is approximately 0.1 μm, which is thinner as compared with the wiring produced in Example 1.

Figure 6:
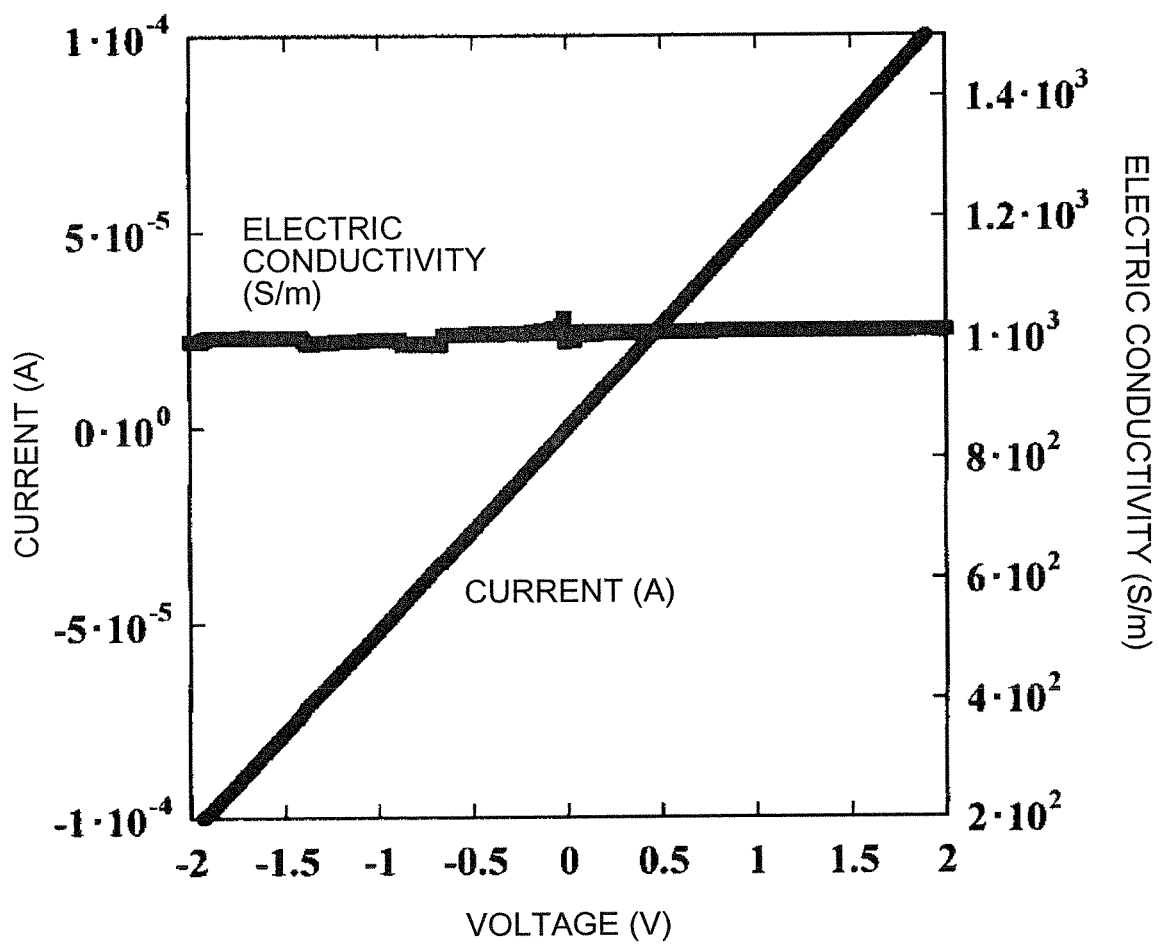
FIG. 6 is a view showing current-voltage characteristics measured for silver wiring produced in Comparative Example 1.

In addition, current-voltage characteristics are measured by the same method as in Example 1. The results are shown in FIG. 6. As shown in FIG. 6, the electric conductivity is approximately $1 \times 10^3$ S/m, which is lower by two digits as compared with Example 1, and the current value is also low, so that it is conceived that scattered toner brings higher resistance of the wiring and application failure of the silver paste.

Example 2

A mask whose line width and line interval are both 100 μm is designed on a desktop PC by using a drawing software (trade name: ILLUSTRATOR, manufactured by Adobe Systems Incorporated.). On that occasion, the mask of the wiring is designed as a so-called negative mask in which an area to apply a conductive material (a wiring area) is not printed at all.

The above negative mask is printed in a mirror image on the same transfer film as in Example 1 with DocuCenter C5540I (manufactured by Fuji Xerox Co., Ltd.).

A PEN film (manufactured by Teijin Teonex Ltd., a thickness of 125 μm) as a substrate to be wired is superposed on the mask side of this transfer film to transfer the toner mask printed on the transfer film at a pressure of 1 MPa and a temperature of 85° C. for 30 seconds by using a vacuum heater press, which transfer film is peeled after being cooled.

Spin coating is performed on the toner mask-printed side of this substrate to be wired at normal temperature in the air by using silver paste (trade name: DCG-102C-CN20, manufactured by Sumitomo Metal Mining Co., Ltd., Ag of 20 wt %, water, surface-active agent). The number of revolutions on that occasion is approximately 1500 rpm. Thereafter, annealing is performed at a temperature of 120° C. in the air for 1 hour for sintering the particles of the silver paste. After annealing, ultrasonic cleaning is performed in acetone for 30 seconds by using an ultrasonic cleaner (trade name: UT-105S, manufactured by Sharp Corporation, an output of 35 kHz, 100 W) for removing the mask.

Figure 7:
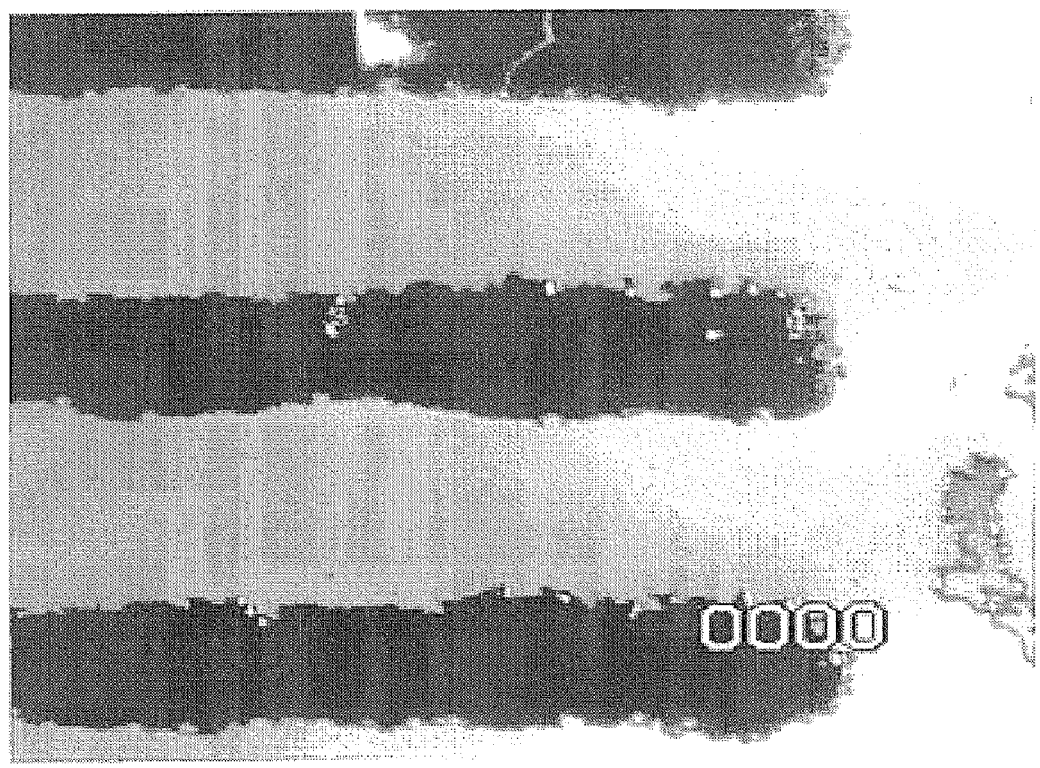
FIG. 7 is a microphotograph showing a part of silver wiring produced in Example 2.

After acetone cleaning, the substrate is observed by a stereoscopic microscope. FIG. 7 is a microphotograph thereof. As shown in FIG. 7, it is found that the silver wiring is evenly formed at a width of approximately 90 μm. On the other hand, the interval of the wiring is approximately 120 μm. Both wiring width and wiring interval are close to intended value (100 μm), and it is found that the thin line is formed with favorable accuracy.

Also, when the silver wiring area of this substrate is measured by a surface roughness tester (trade name: Dektak 3030, manufactured by Sloan Corporation), the thickness is approximately 2 μm.

In addition, when current-voltage characteristics are measured with a prober by the same method as in Example 1, the electric conductivity is approximately $6 \times 10^{-5}$ S/m. This result shows that this method allows the thin line of 100 μm or less to be also produced.

Example 3

A negative mask is designed by the same method as in Example 1, and the mask printed with a toner on the same transfer film (transfer substrate) as in Example 1 is transferred to the PEN film (substrate to be wired).

Spin coating is performed on the toner mask-transferred side of this substrate to be wired at normal temperature in the air by using 3,4-ethylenedioxythiophene/polystyrene sulfonic acid (PEDOT/PSS, trade name: Agfa orgacon S-300). The number of revolutions on that occasion is approximately 1500 rpm.

Thereafter, annealing is performed at a temperature of 100° C. in the air for 1 hour for drying PEDOT/PSS. After annealing, ultrasonic cleaning is performed in acetone for 30 seconds for removing the mask.

After acetone cleaning, when the substrate with PEDOT/PSS applied thereon is observed by a stereoscopic microscope, the wiring is evenly formed at a width of approximately 200 μm, similarly to the case of using the silver paste in Example 1. When the PEDOT/PSS wiring area of this substrate is measured by a surface roughness tester (trade name: Dektak 3030, manufactured by Sloan Corporation), the thickness is approximately 1 μm.

Figure 8:
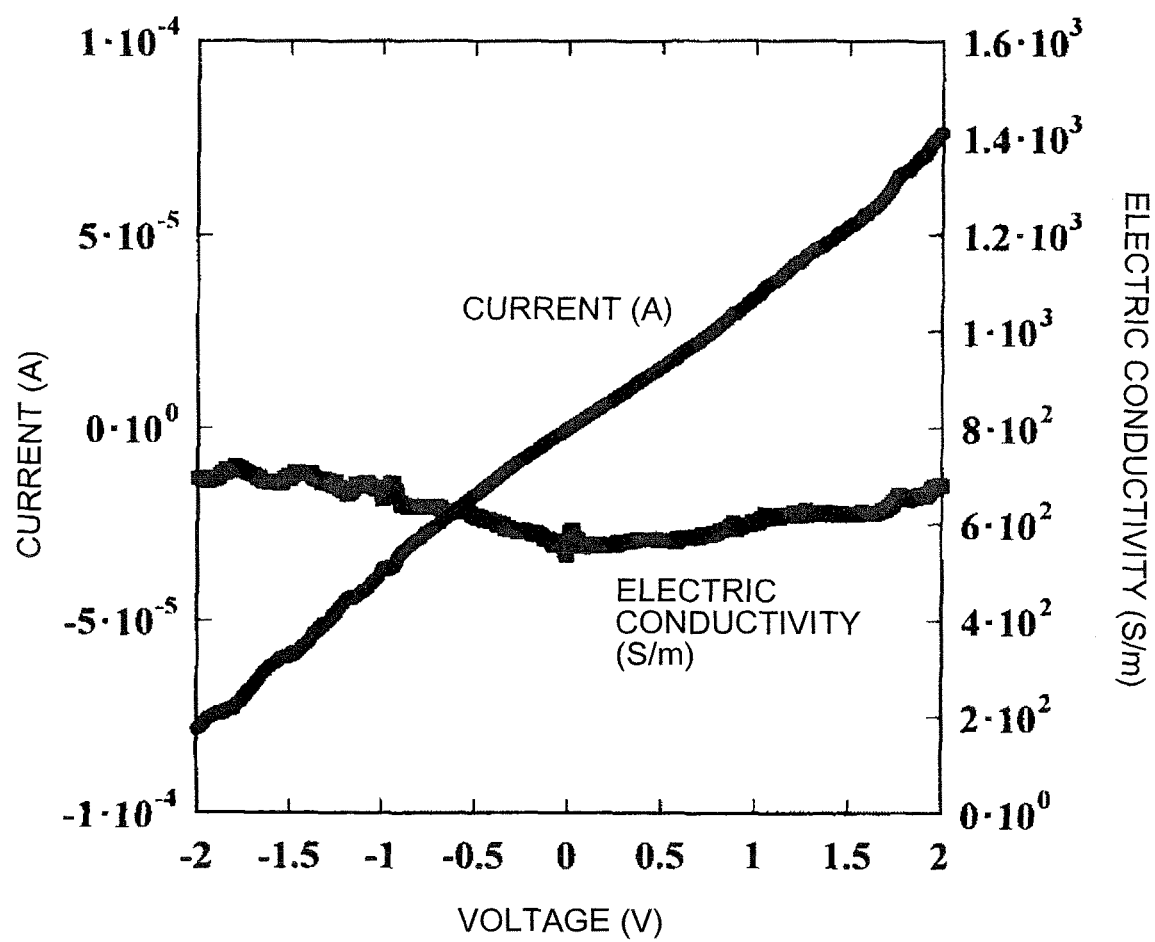
FIG. 8 is a view showing current-voltage characteristics measured for organic wiring produced in Example 3.

Next, current-voltage characteristics of the PEDOT/PSS wiring are measured by using a semiconductor parameter analyzer (trade name: 4156B, manufactured by Agilent Technologies Japan, Ltd.) and a prober. The results are shown in FIG. 8.

The electric conductivity is approximately $6 \times 10^2$ S/m. The electric conductivity of standard PEDOT/PSS is approximately $10^3$ S/m, so that this method allows wiring to be performed with favorable accuracy even though a conductive organic material is used.

Example 4

A negative mask is designed by the same method as in Example 2, and the mask printed with toner on the same transfer film (transfer substrate) as in Example 1 is transferred to the PEN film (substrate to be wired).

Spin coating is performed on the toner mask-formed side of this substrate to be wired at normal temperature in the air by using 3,4-ethylenedioxythiophene/polystyrene sulfonic acid (PEDOT/PSS, trade name: Agfa orgacon S-300). The number of revolutions on that occasion is approximately 1500 rpm.

Thereafter, annealing is performed at a temperature of 100° C. in the air for 1 hour for drying PEDOT/PSS. After annealing, ultrasonic cleaning is performed in acetone for 30 seconds for removing the mask.

After acetone cleaning, when the substrate is observed by a stereoscopic microscope, the PEDOT/PSS wiring is evenly formed at a width of approximately 100 μm.

In addition, when the PEDOT/PSS wiring area of this substrate is measured by a surface roughness tester (trade name: Dektak 3030, manufactured by Sloan Corporation), the thickness is approximately 1 μm.

Also, when current-voltage characteristics are measured with a prober by the same method as in Example 3, the electric conductivity is approximately $6 \times 10^2$ S/m. This result shows that this method allows the thin line of 100 μm or less to be also produced by using a conductive organic material.

Comparative Example 2

A mask whose line width and line interval are both 200 μm is designed on a desktop PC by using a drawing software (trade name: ILLUSTRATOR, manufactured by Adobe Systems Incorporated.). On that occasion, the mask of the wiring is designed as a so-called negative mask in which an area to apply a conductive material (a wiring area) is not printed at all.

The above negative mask is printed on an OHP film (trade name: XEROXSHEET, manufactured by Fuji Xerox Co., Ltd., a thickness of 100 μm) with DocuCenter C5540I (manufactured by Fuji Xerox Co., Ltd.).

Spin coating is performed on the mask-printed side of this substrate to be wired at normal temperature in the air by using PEDOT/PSS (trade name: Agfa orgacon S-300). The number of revolutions on that occasion is approximately 1500 rpm. Thereafter, annealing is performed at a temperature of 100° C. in the air for 1 hour for drying PEDOT/PSS. After annealing, ultrasonic cleaning is performed in acetone for 30 seconds for removing the mask.

After acetone cleaning, when the substrate is observed by a stereoscopic microscope, black particles exist in the wiring in places. These black particles are toner scattered in the non-image area.

When the film thickness of the wiring area is measured, the value is approximately 0.8 μm, which is somewhat thinner as compared with the PEDOT/PSS wiring formed in Example 3. The surface of the wiring is greatly irregular for the reason that PEDOT/PSS is also applied on toner.

Figure 9:
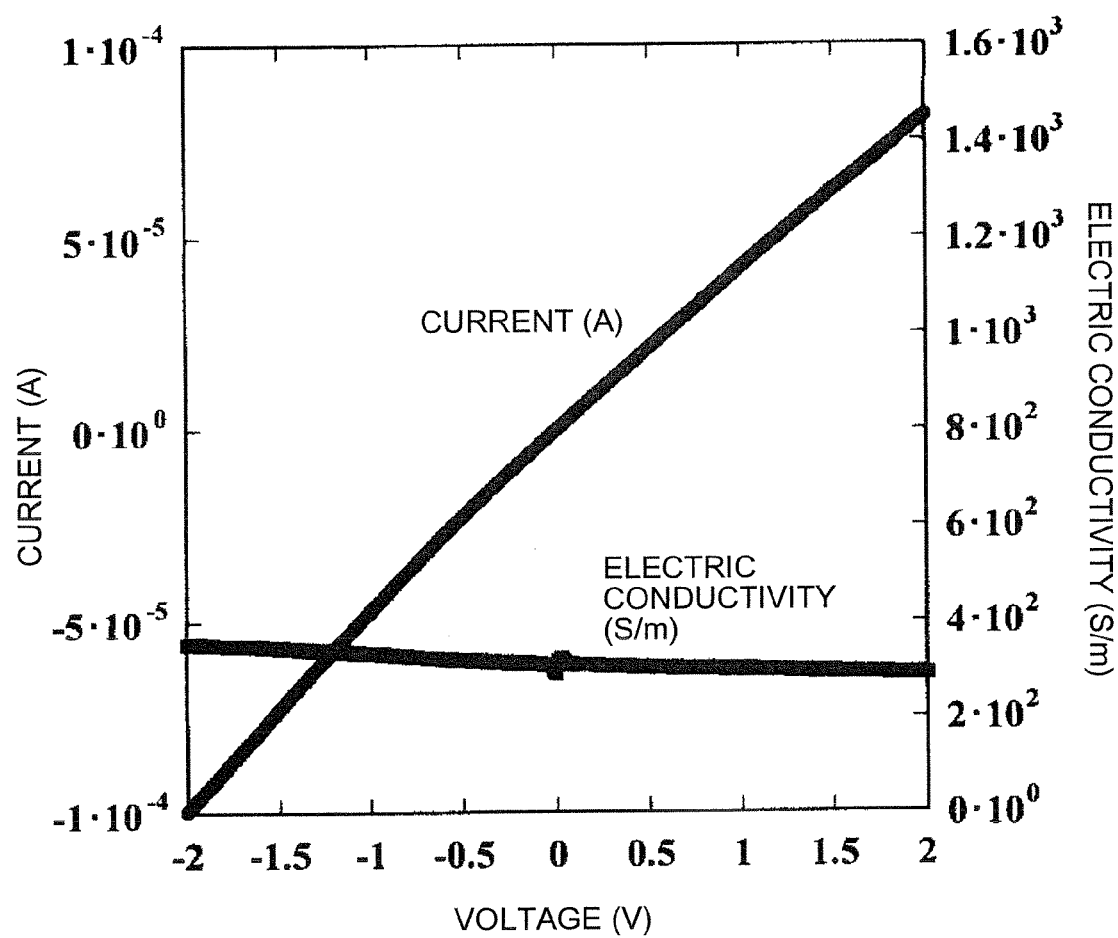
FIG. 9 is a view showing current-voltage characteristics measured for organic wiring produced in Comparative Example 2.

Current-voltage characteristics are measured by the same method as in Example 3. The results are shown in FIG. 9. The electric conductivity is lower as compared with Example 3. In Comparative Example 1 using the silver paste, large numbers of places having no silver paste applied thereon are caused in the wiring area to bring higher resistance of the wiring; and also the case of PEDOT/PSS brings somewhat higher resistance at low rate.

Example 5

Figure 10:
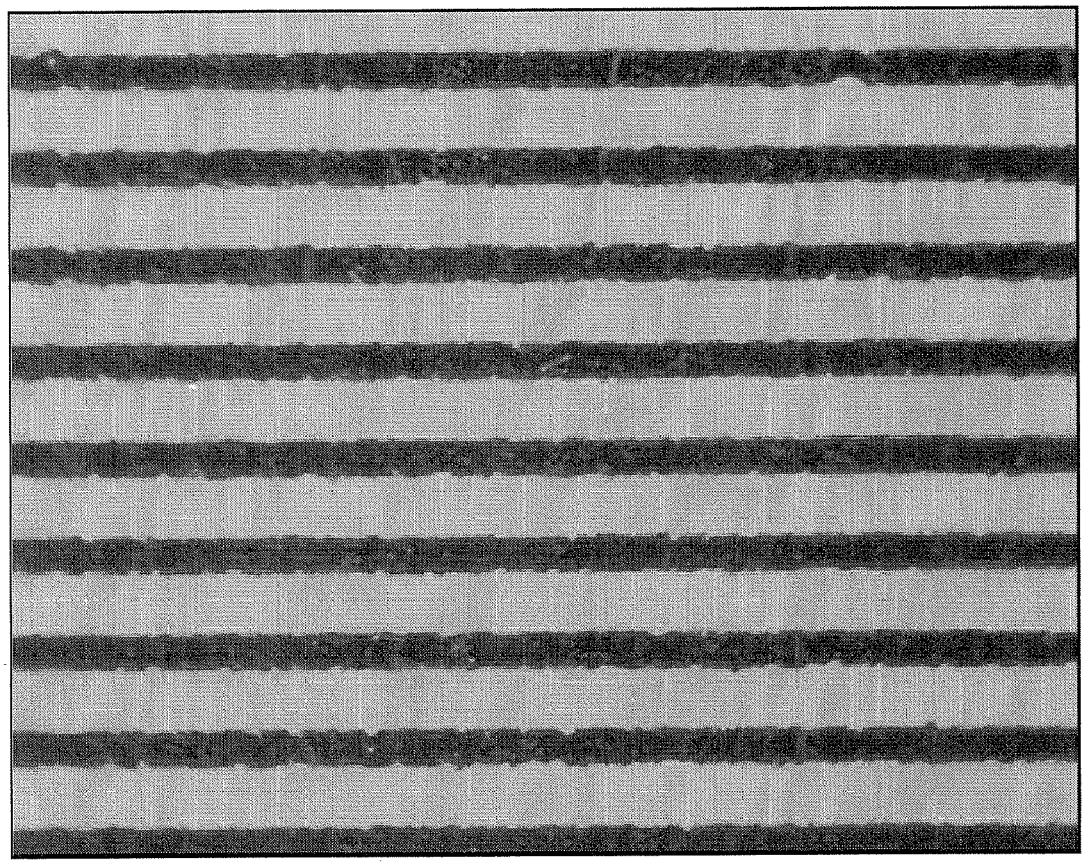
FIG. 10 is a microphotograph of a toner mask transferred onto a curved surface.
Figure 11:
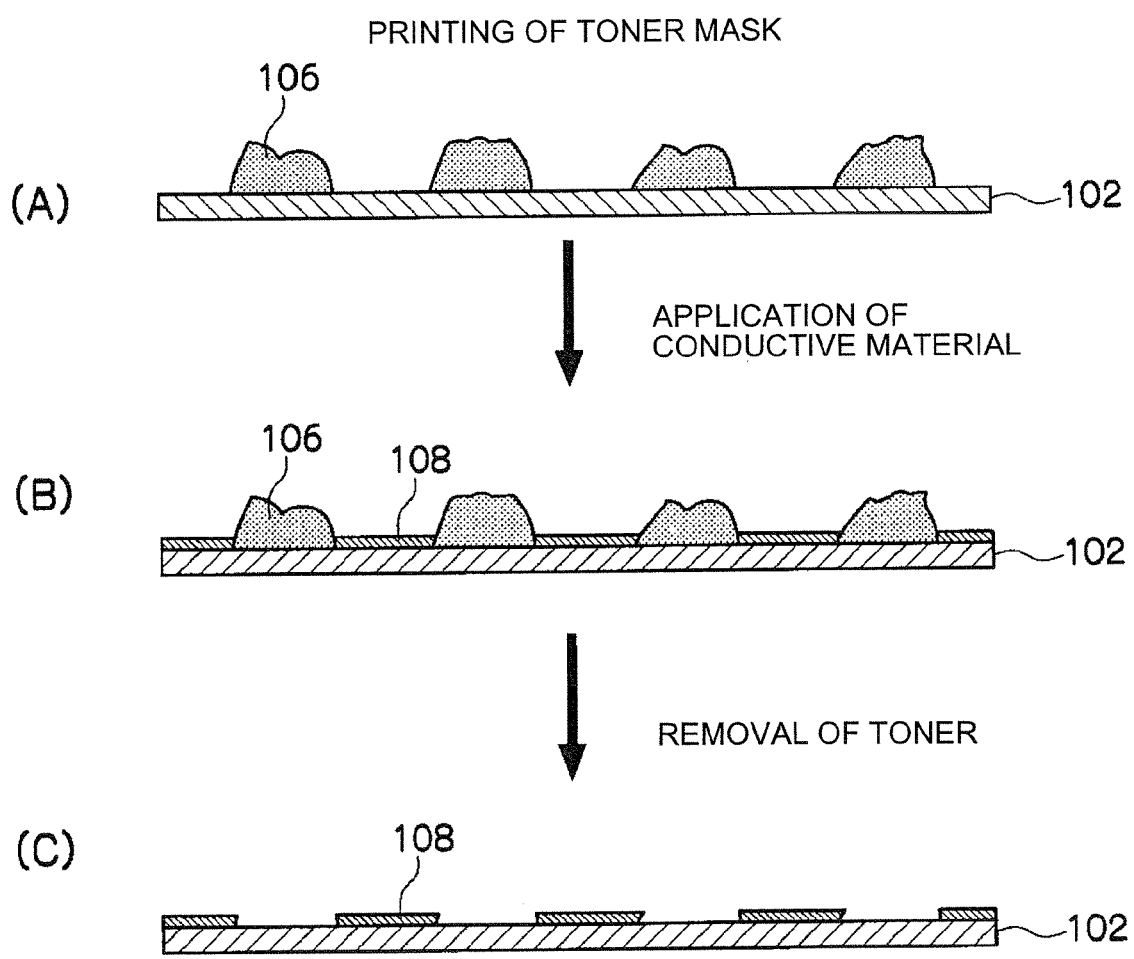
FIG. 11 is a process drawing showing one example of a conventional line patterning method.

The toner mask printed in a mirror image on the same transfer film as is used in Example 1 is superposed on the outer wall (the curved surface) of a columnar member made of fluororesin, and transferred while revolved at a pressure of 1 MPa and a temperature of 85° C. for 30 seconds. FIG. 10 is a microphotograph of the mask after being transferred. The mask is transferred on the curved surface and scattered toner is not confirmed.

Next, dip coating is performed by the same method as in Example 1 at normal temperature in the air by using silver paste (trade name: DCG-102C-CN20, manufactured by Sumitomo Metal Mining Co., Ltd., Ag of 20 wt %, water, surface-active agent). The pull-up rate on that occasion is 1 cm/min.

Thereafter, annealing is performed at a temperature of 120° C. in the air for 1 hour for sintering the particles of the silver paste. After annealing, ultrasonic cleaning is performed in acetone for 30 seconds for removing the mask.

After cleaning, when one of the wiring is measured by a tester, the value is approximately 13Ω at a length of 1 cm.

This result shows that the mask is once printed on a bendable thin film (a flexible substrate), and transferred to a member having a curved surface, whereby the high-definition mask from which the scattered toner has been removed may be easily formed on the curved surface, and wiring may be formed using this mask.

What is claimed is:

1. A production apparatus of a wired member, comprising:
    a mask forming unit that forms a mask on a transfer substrate by using a plurality of toner particles in accordance with an electrophotographic method so as to be transferable to a member to be wired, the mask corresponding to a wiring pattern to be formed on the member to be wired;
    a mask transferring unit that transfers the mask, formed on the transfer substrate by the plurality of toner particles, to the member to be wired, wherein the mask transferring unit is configured such that the plurality of toner particles are integrated with each other before the transfer substrate and the member to be wired are separated;
    a conductive film forming unit that supplies a conductive material onto the mask-transferred side of the member to be wired to form a film of the conductive material thereon; and
    a mask removing unit that removes the mask from the member to be wired on which the film of the conductive material has been formed.

2. The apparatus of claim 1, wherein the mask transferring unit comprises a heating and pressing roller.

3. The apparatus of claim 1, wherein the conductive film forming unit comprises an ejector that supplies a solution of the conductive material.

4. The apparatus of claim 1, wherein the mask removing unit comprises an ultrasonic cleaner.

5. The apparatus of claim 1, wherein the mask transferring unit is configured to heat and fix the mask before the transfer substrate and the member to be wired are separated.

6. A production method of a wired member, comprising:
    forming a mask on a transfer substrate by using a plurality of toner particles in accordance with an electrophotographic method so as to be transferable to a member to be wired, the mask corresponding to a wiring pattern to be formed on the member to be wired;
    transferring the mask, formed on the transfer substrate by the plurality of toner particles, to the member to be wired, wherein the plurality of toner particles are integrated with each other before the transfer substrate and the member to be wired are separated;

supplying a conductive material onto the mask-transferred side of the member to be wired to form a film of the conductive material thereon; and removing the mask from the member to be wired on which the film of the conductive material has been formed.

7. The production method of claim 6, wherein a substrate having flexibility is used as the transfer substrate.

8. The production method of claim 6, wherein a thickness of the transfer substrate is approximately 50 μm to 0.2 mm.

9. The production method of claim 6, wherein the transfer substrate comprises a release layer at the mask-formed side thereof.

10. The production method of claim 6, wherein an average particle diameter of each of the plurality of toner particles is approximately 1 to 20 μm.

11. The production method of claim 6, wherein the mask is formed so as to have a thickness of approximately 3 to 20 μm.

12. The production method of claim 6, wherein the transfer is performed by pressing and heating.

13. The production method of claim 6, wherein the conductive material comprises an inorganic conductive material.

14. The production method of claim 6, wherein the conductive material comprises an organic conductive material.

15. The production method of claim 6, wherein the member to be wired has a curved surface at the wiring pattern-formed side thereof.

16. The production method of claim 6, wherein the transferring the mask further comprises heating and fixing the mask before the transfer substrate and the member to be wired are separated.

* * * * *